(12) United States Patent
Rajavel et al.

(10) Patent No.: US 8,193,611 B1
(45) Date of Patent: Jun. 5, 2012

(54) HIGH PERFORMANCE INAS-BASED DEVICES

(75) Inventors: Rajesh Rajavel, Oak Park, CA (US); Ken Elliott, Thousand Oaks, CA (US); David Chow, Newbury Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 888 days.

(21) Appl. No.: 11/641,917

(22) Filed: Dec. 19, 2006

(51) Int. Cl.
*H01L 29/22* (2006.01)
(52) U.S. Cl. .... 257/613; 257/615; 257/20; 257/E29.089
(58) Field of Classification Search .................. 257/613, 257/615, 20, E29.089
See application file for complete search history.

(56) References Cited

U.S. PATENT DOCUMENTS 5,995,529 A * 11/1999 Kurtz et al. ............... 372/45.01

OTHER PUBLICATIONS

J. Bergman, G. Nagy, G. Sullivan, B. Brar, C. Kadow, H.-K. Lin, A. Gossard, and M. Rodwell, "InAs/AlSb HFETs with ft and fmax above 150 GHz for low-power MMICs," in *Proc. 15th Int. Conf. IPRM*, May 2003, pp. 219-222.
Kadow, C., et al., J. Cryst. Growth, 251, pp. 543-546 (2003).
Shibata, T., et al., "Stencil mask ion implantation technology," IEEE Transactions on semiconductor manufacturing, vol. 15, No. 2, pp. 183-188 (May 2002).

* cited by examiner

*Primary Examiner* — Jack Chen
(74) *Attorney, Agent, or Firm* — Ladas & Parry

(57) ABSTRACT

Material layer structures that have high mobility, a high conduction band barrier and materials that can be implanted to enable higher performance FET device. The structures contain a quantum well layer disposed between two barriers and disposed above a buffer layer and a substrate.

11 Claims, 4 Drawing Sheets

HIGH PERFORMANCE INAS-BASED DEVICES

STATEMENT REGARDING FEDERALLY SPONSORED RESEARCH OR DEVELOPMENT

The present invention was made with support from the United States Government under contract N660001-01-C-8033 awarded by the DARPA. The United States Government has certain rights in the invention.

FIELD OF THE INVENTION

The present invention relates to field effect transistor (FET) devices. More particularly, the present invention relates to InAs-based FET devices and InAs-based CC devices that exhibit low intrinsic charge, high mobility, good electron and hole confinement, and have low access resistance.

BACKGROUND

FET devices such as, for example, InAs-based HEMT devices have potential application for sub-millimeter-wave electronics. However, the parasitic access resistance of the device channel currently limits InAs-based HEMT devices' transconductance and cutoff frequency. Higher cut-off frequency HEMT devices could be obtained if HEMT devices' resistance were reduced. Although ion implantation would be an ideal technique for reducing access resistance, unfortunately the HEMT device material layer structures commonly used to make high mobility InAs-based HEMTs such as InAlAs do not exhibit sufficient activation to be practical. Although InAsP is a suitable material, it has a relatively low barrier height and is less suitable for a Schottky layer than InAlAs.

Furthermore, current InAs-channel HEMTs employ AlSb material as the barrier on either side of the InAs channel. However, AlSb material has certain disadvantages. For example, due to the Type II band alignment of AlSb and InAs, AlSb offers no hole confinement resulting in poor breakdown voltage.

Also, due to the reactivity of Al with air, it is not straightforward to achieve high conductivity in Al containing alloys such as AlSb through selective doping techniques like ion-implantation. Ability to achieve low sheet resistance through selective doping is needed for reduced access and contact resistances.

Typical transport properties for InAs-based HEMTS reported in the literature are:

Electron mobility=10,800 cm$^2$/Vs, $N_s$=2×10$^{11}$ cm$^{-2}$, $R_{sh}$=2,900 ohms/square in Be doped InAs HEMTs. See C. Kadow, H-K. Lin, M. Dahlstrom, M. Rudwell, A. C. Gossard, B. Brar and G. Sullivan, J. Cryst. Growth, 251 (2003) 543-546.

Electron mobility=19,000 cm$^2$/Vs, Ns=3.7E12 cm$^{-2}$, $R_{sh}$=100 ohms/square. See 2003 IPRM, Santa Barbara, Calif., May 12-16, 2003, by J. Bergman, G. Nagy, G. Sullivan, B. Brar, C. Kadow, H-K Lin, A. C. Gossard and M. Rudwell.

What is needed is a material layer structure that has high mobility, a high conduction band barrier and materials that can be implanted to enable higher performance FET devices is presented. The present disclosure answers these and other needs.

SUMMARY OF THE INVENTION

According to a first aspect, a field effect transistor structure is disclosed, comprising: a substrate, a buffer layer disposed on the substrate, a lower barrier containing InAsP material disposed on the buffer layer, a quantum well layer containing InAs material, and an upper barrier containing InAsP material disposed on the quantum well layer.

According to a second aspect, a field effect transistor structure is disclosed, comprising: a substrate, a buffer layer disposed on the substrate, a lower barrier containing InAs$_y$P$_{1-y}$ material disposed on the buffer layer, a quantum well layer containing InAs material or an alloy of InAs material disposed on the lower barrier, wherein the alloy of InAs material contains at least 80% of the InAs material, and an upper barrier containing InAs$_y$P$_{1-y}$ material disposed on the quantum well layer.

DETAILED DESCRIPTION

Figure 1:
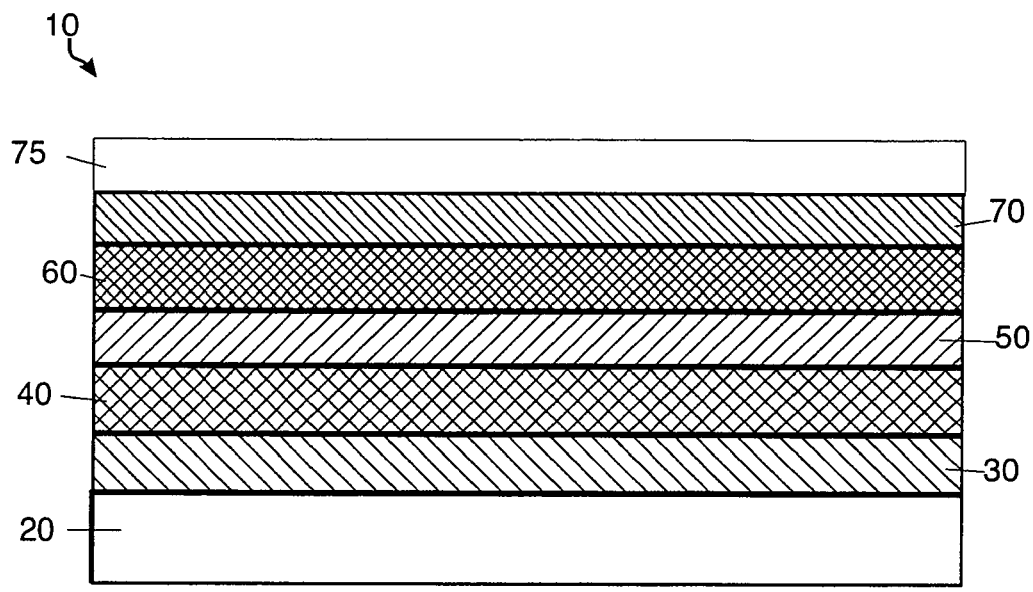
FIG. 1 depicts an exemplary embodiment of a material layer structure in accordance with the present disclosure.

In one exemplary embodiment, to provide FET devices such as, for example, HEMT with high mobility and good electron and hole confinement, a material layer structure 10 may be grown as shown in FIG. 1. To obtain high mobility, a high conduction band barrier and to enable higher performance, the quantum well layer 60 is confined by using wider band-gap InAsP layers 50 and 70 as the barriers in the material layer structure 10. The InAsP material may, for example, have the following properties: InAs$_{0.5}$P$_{0.05}$ or InAs$_{0.6}$P$_{0.4}$. The quantum well layer 60 may be composed of, for example, InAs material about 100 Å in thickness. The wider band-gap layers 50 and 70 may be composed of, for example InAsP material from about 200 Å to about 600 Å. Layer 75 is a contact layer and may be composed of InAs or an alloy containing at least 75% InAs, with a thickness of about 100 Å to 500 Å.

Figure 2:
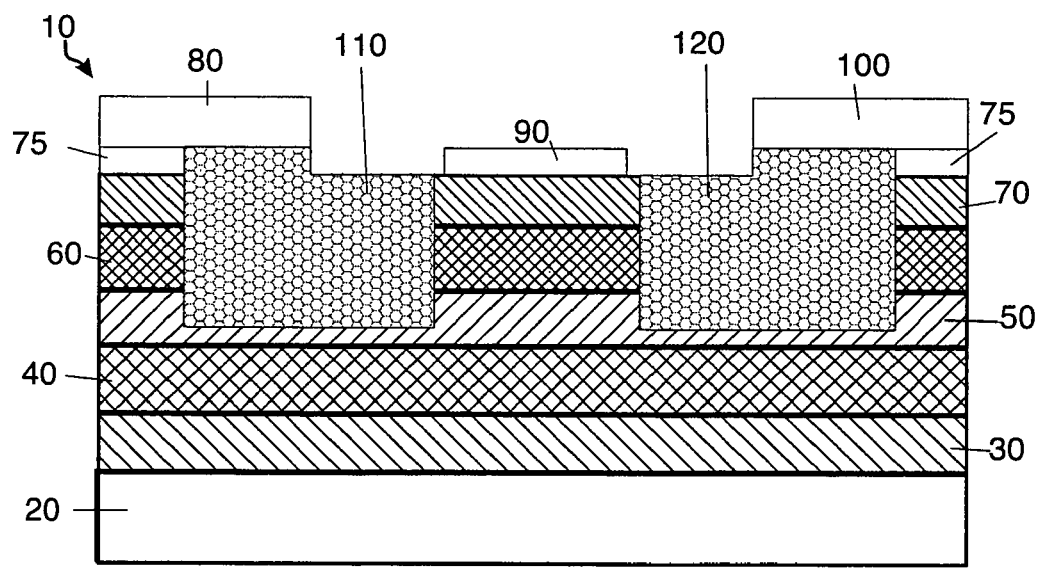
FIG. 2 depicts the FET device of FIG. 1 containing ion-implanted regions in accordance with the present disclosure.

The quantum well layer 60 confined by the wider band-gap layers 50 and 70 of the material layer structure 10 may be deposited on a substrate 20 through the use of buffers layers 30 and 40 and may contain electrically conductive contacts 80, 90 and 100, as shown in FIG. 2. The substrate 20 may contain, for example, InP, and the buffer layer 40 that may contain, for example, AlGaAsSb material from about 2,000 Å to about 15,000 Å in thickness, and the buffer layer 30 may contain, for example, InAlAs or InP materials from about 400 Å to about 1,000 Å in thickness.

Due to Type-I band alignment with InAs quantum well layer 60, the wider band-gap InAsP barrier layers 50 and 70 provide electron and hole confinement in the quantum well layer 60. Hole confinement improves breakdown and output conductance and also enables efficient p-type compensation doping for fabricating enhancement-mode HEMTs. The material layer structure 10 shown in FIG. 1 may exhibit mobilities in the range of about 15,000 cm$^2$/Vs to about 21,000 cm$^2$/Vs.

To achieve low sheet resistance in the material layer structure 10, the layers 50, 70 and 75 may be ion-implantated with silicon (Si) regions 110 and 120, as shown in FIG. 2. Selective doping via ion-implantation reduced access and contact resistances, leading to high ft values. The material layer structure 10 shown in FIG. 2 may exhibit intrinsic channel sheet charge of about 3×10$^{11}$ cm$^{-2}$.

Figure 3:
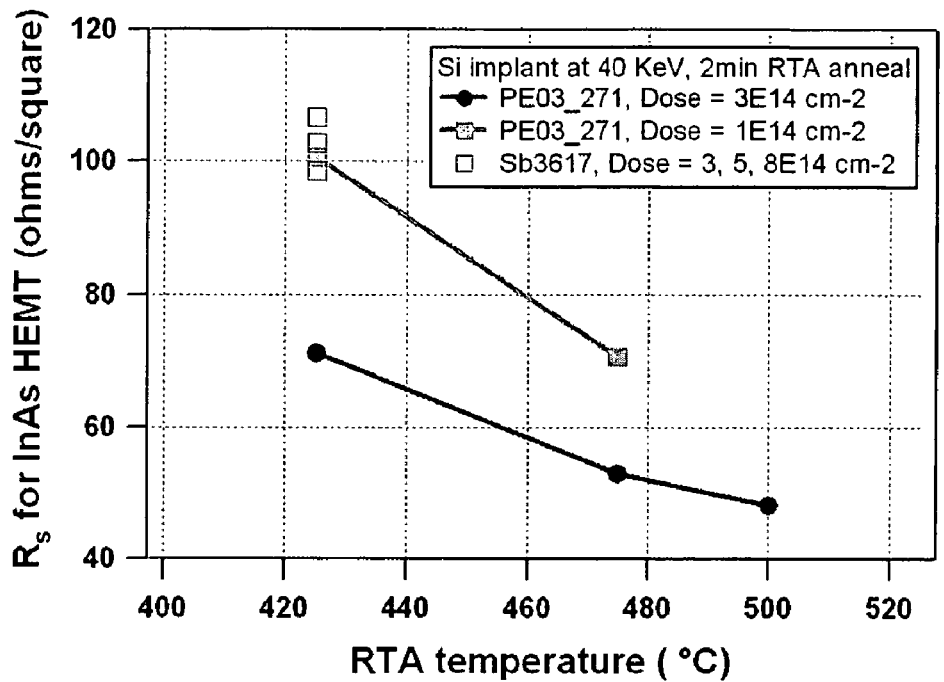
FIG. 3 depicts a plot of sheet resistance for the FET device of FIG. 2.

FIG. 3 illustrates the low sheet resistance achieved for the material layer structure 10 through the ion-implantation of Si, as shown in FIG. 2. As shown in FIG. 3, the sheet resistances of <80 ohms/square was achieved by implanting Si, and annealing at temperatures as low as 425° C. Samples were annealed in an RTA system, using a cover wafer.

Figure 4:
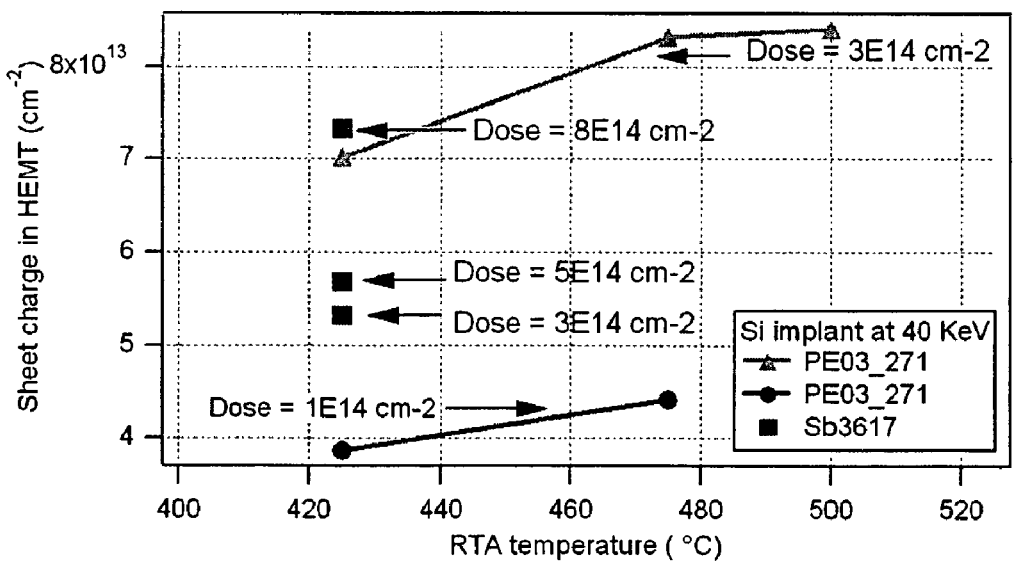
FIG. 4 depicts a plot of the sheet charge for the FET device of FIG. 2.

FIG. 4 illustrates that a sheet charge as high as 8×10$^{13}$ cm$^{-2}$ was measured for the ion-implanted devices such as the material layer structure 10 shown in FIG. 2.

Figure 5:
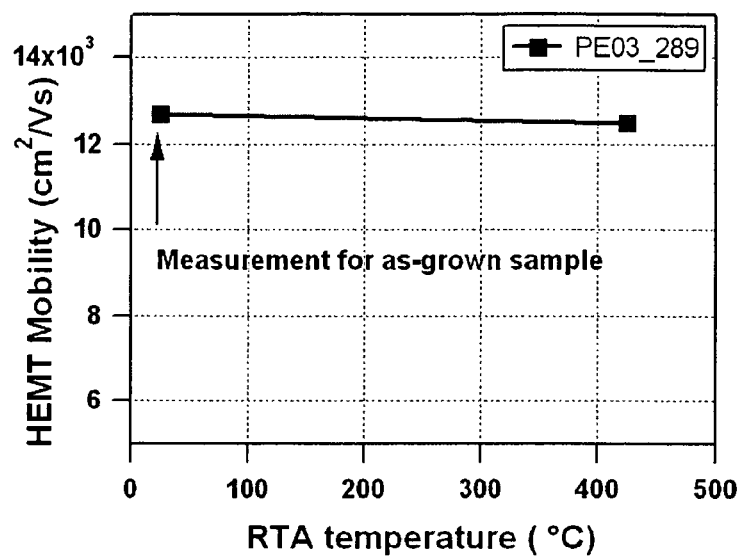
FIG. 5 depicts a plot of thermal stability of the FET device of FIG. 2.

FIG. 5 illustrates the thermal stability of the material layer structure 10 shown in FIG. 2 following a 425° C. RTA cycle. The value of the mobility was virtually unchanged following the anneal.

The ion implantation of regions 110 and 120 may be performed by regular masked implantation or by stencil mask ion implantation technology. See for example Takeshi Shibata et al, "Stencil mask ion implantation technology", IEEE Transactions on semiconductor manufacturing, Vol, 15, No. 2, May 2002, pp. 183-188.

Figure 6:
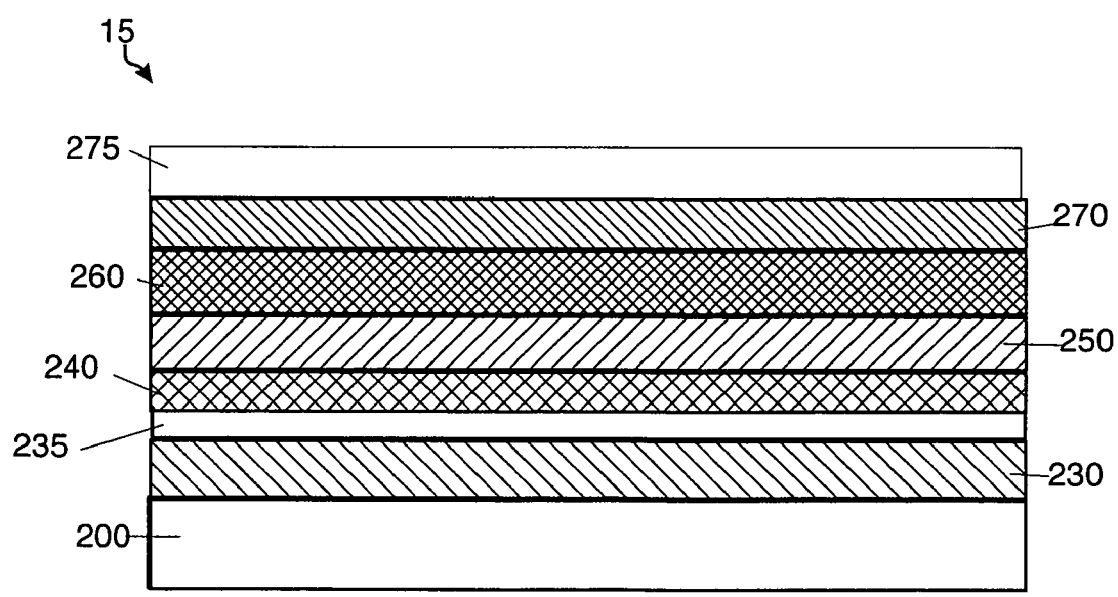
FIG. 6 depicts another exemplary embodiment of a material layer structure in accordance with the present disclosure.

In another exemplary embodiment, to provide FET devices such as, for example, HEMT with high mobility and good electron and hole confinement, a material layer structure 15 may be grown as shown in FIG. 6. In the material layer structure 15, the quantum well layer 260 is confined by using wider band-gap layers 250 and 270 as the barriers. The quantum well layer 260 may be composed of, for example, InAs material about 100 Å in thickness or an alloy of InAs containing at least 80% of InAs. The wider band-gap layer 250 may be composed of, for example InAs$_y$P$_{1-y}$ material from about 200 Å to about 600 Å in thickness, where y ranges from about 30% to about 60%. The InAs$_y$P$_{1-y}$ may, for example, have the following properties: InAs$_{0.5}$P$_{0.05}$ or InAs$_{0.6}$P$_{0.4}$. The wider band-gap layer 270 may be composed of, for example In$_x$Al$_{1-x}$As material with thicknesses from about 200 Å to about 600 Å or an alloy of InAlAs containing at least 80% of In$_{0.7}$Al$_{0.3}$As. The InAlAs may, for example, have the following composition: In$_{0.7}$Al$_{0.3}$As. Layer 275 is a contact layer and may be composed of InAs or an alloy containing at least 75% InAs, with a thickness of about 100 Å to 500 Å.

Figure 7:
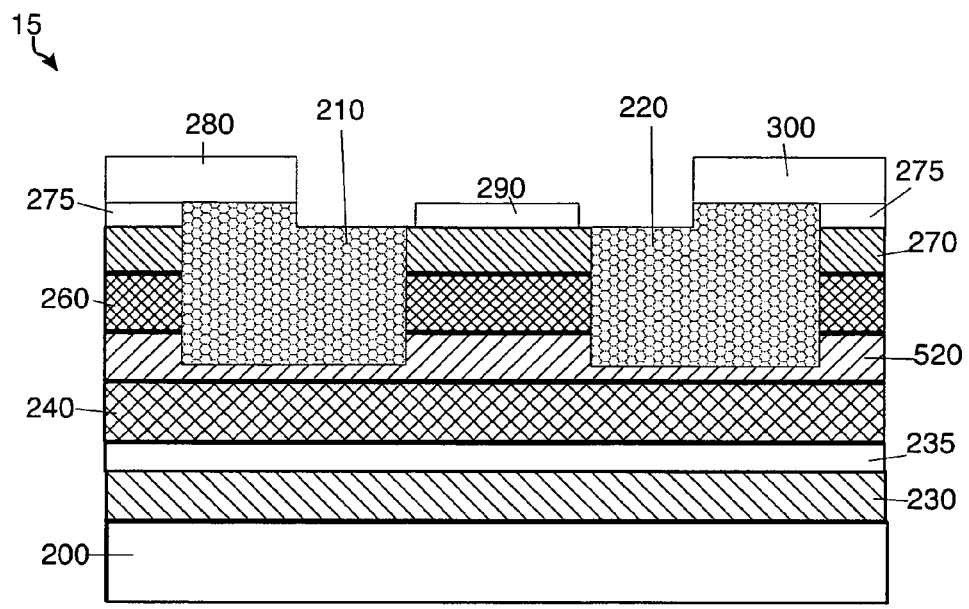
FIG. 7 depicts the FET device of FIG. 6 containing ion-implanted regions.

The quantum well layer 260 confined by the wider band-gap layers 250 and 270 of the material layer structure 15 may be deposited on a substrate 200 through the use of buffers layers 230, 235 and 240 and may contain electrical contacts 280, 290 and 300, as shown in FIG. 7. The substrate 200 may contain, for example, InP material with lattice constant of about 5.868 Å, the buffer layer 240 may contain, for example, AlGaAsSb material from about 2,000 Å to about 15,000 Å in thickness with lattice constant of about 6.03 Å, the buffer layer 235 may contain, for example, AlGaAsSb material from about 100 Å to about 500 Å in thickness with lattice constant of about 5.868 Å, and the buffer layer 230 may contain, for example, InAlAs material from about 400 Å to about 1,000 Å in thickness with lattice constant of about 5.868 Å.

To achieve low sheet resistance in the material layer structure 15, the layers 250, 270 and 275 may be ion-implanted with regions 210 and 220 containing n-type or p-type dopant species such as, for example, silicon (Si), Cadmium (Cd), Beryllium (Be) or Zinc (Zn) as shown in FIG. 7. Selective doping via ion-implantation reduced access and contact resistances, leading to high ft values. The material layer structure 15 shown in FIG. 7 may exhibit intrinsic channel sheet charge of about 4×10$^{11}$ cm$^{-2}$ and mobility of about 18,000 cm$^2$/Vs.

Figure 8:
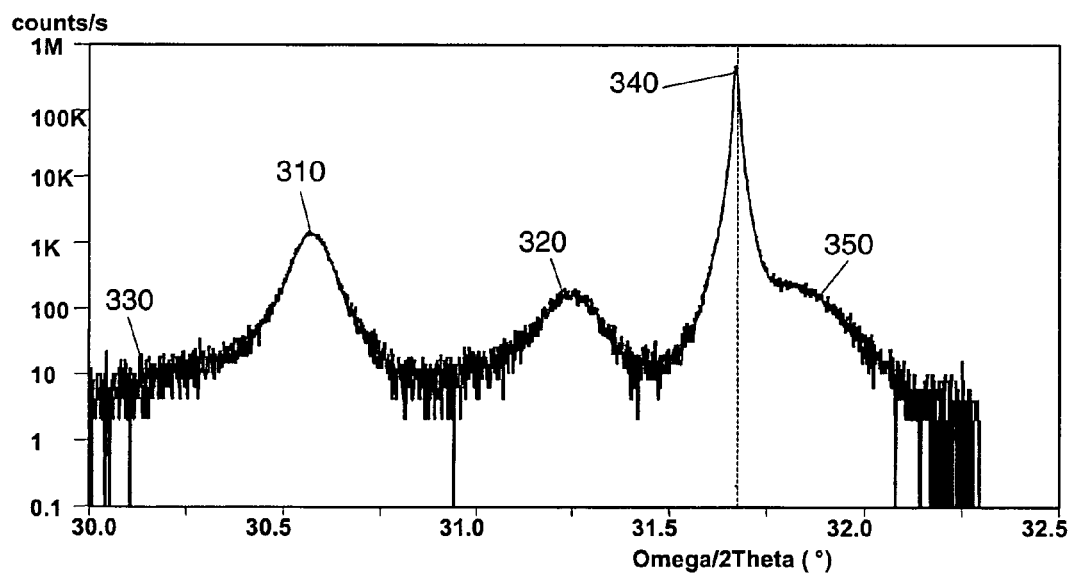
FIG. 8 depicts an X-ray rocking curve for the FET device of FIG. 7.

FIG. 8 illustrated an X-ray rocking curve for the material layer structure 15 shown in FIG. 7. The peak 310 at ~30.5 degrees is from the AlGaAsSb buffer layer 240. The peak 320 at ~31.25 degrees is from the InAsP and InAlAs layers 250 and 270, respectively. The peak 330 for the strained InAs quantum well layer 260 is the weak peak at ~30.2 degrees. The peak 350 to the right of the intense InP substrate 200 peak 340 is from the buffer layer 235 that is not perfectly lattice matched to the substrate.

The foregoing detailed description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "step(s) for . . . ."

What is claimed is:

1. A field effect transistor structure comprising:
    a substrate;
    a buffer layer disposed on the substrate;
    a lower barrier containing InAs$_y$P$_{1-y}$ material disposed on the buffer layer;
    a quantum well layer of said field effect transistor structure, said quantum well layer containing InAs material or an alloy of InAs material disposed on the lower barrier, wherein the alloy of InAs material contains at least 80% of the InAs material; and
    an upper barrier containing InAs$_y$P$_{1-y}$ material disposed on the quantum well layer.

2. The field effect transistor structure of claim 1, further comprising a contact layer disposed on the upper barrier.

3. The field effect transistor structure of claim 1, wherein the mole fraction (y) of the InAs$_y$P$_{1-y}$ material of the lower barrier and the upper barrier is between 30% and 60%.

4. The field effect transistor structure of claim 1, wherein the lower barrier, the upper barrier and the quantum well layer each comprise a plurality of ion-implanted regions to lower sheet resistance of the structure.

5. The field effect transistor structure of claim 1, wherein the buffer layer comprises:
   a layer containing InAlAs or InP material disposed on the substrate and
   a layer containing AlGaAsSb material disposed on the layer containing InAlAs or InP material.

6. The field effect transistor structure of claim 2, wherein the contact layer contains InAs material or an alloy of InAs containing at least 75% of InAs.

7. The field effect transistor structure of claim 1, wherein the lower barrier, the upper barrier and the quantum well layer each include Si ion-implanted regions.

8. The field effect transistor structure of claim 7 each Si ion-implanted region completely penetrates the upper barrier and the quantum well layer and at least partially penetrates the lower barrier.

9. The field effect transistor structure of claim 8 wherein electrically conductive contacts are disposed immediately above at least a portion of each of the Si ion-implanted regions.

10. The field effect transistor structure of claim 9 wherein a contact layer comprising InAs or an alloy of InAs is disposed between a portion of said electrically conductive contacts and said upper barrier.

11. The field effect transistor structure of claim 1, wherein said upper and lower barriers each have a wider band gap than a band gap of said quantum well layer.

* * * * *